United States Patent [19]

Sato

[11] Patent Number: 5,349,239
[45] Date of Patent: Sep. 20, 1994

[54] VERTICAL TYPE CONSTRUCTION TRANSISTOR

[75] Inventor: Hiroya Sato, Tenri, Japan

[73] Assignee: Sharp Kabushiki Kaisha, Osaka, Japan

[21] Appl. No.: 907,614

[22] Filed: Jul. 2, 1992

[30] Foreign Application Priority Data

Jul. 4, 1991 [JP] Japan .................. 3-164262

[51] Int. Cl.⁵ .................. H01L 29/44; H01L 29/70
[52] U.S. Cl. .................. 257/737; 257/163; 257/579; 257/587
[58] Field of Search .......... 257/578, 579, 587, 197, 257/737, 738, 584, 164, 165, 560, 561, 563, 573

[56] References Cited

U.S. PATENT DOCUMENTS

| | | | |
|---|---|---|---|
| 3,585,461 | 6/1971 | Eynon et al. | 257/737 |
| 3,686,698 | 8/1972 | Akeyama et al. | 257/737 |
| 4,054,898 | 10/1977 | Streit et al. | 257/563 |

FOREIGN PATENT DOCUMENTS

| | | |
|---|---|---|
| 0036858 | 11/1972 | Japan . |
| 0069471 | 9/1973 | Japan . |
| 0022346 | 7/1976 | Japan . |
| 0159865 | 12/1979 | Japan . |
| 0003335 | 1/1991 | Japan . |

OTHER PUBLICATIONS

L. F. Miller, IBM J. Res. Develop., May 1969 pp. 239–250.
S. E. Scrupski, Electronics, Feb. 1, 1971; pp. 44–48.
T. Kawanobe et al, Proc. 33rd ECC, 1983, pp. 221–226.
T. R. Myers, Proc. ECC, 1969, pp. 131–144.

*Primary Examiner*—Rolf Hille
*Assistant Examiner*—David B. Hardy

[57] ABSTRACT

A vertical type construction transistor is provided wherein a bump electrode is disposed immediately on the junction portions formed on the surface of the semiconductor basic plate so as to effect a radiating operation with the electrode being connected to a heat sink. As a result the heating of the junction portion formed on the basic plate surface is effectively released, the inductance of the outgoing line is reduced, and the power amplification used in the microwave band is put to practical use.

4 Claims, 4 Drawing Sheets

VERTICAL TYPE CONSTRUCTION TRANSISTOR

BACKGROUND OF THE INVENTION

The present invention generally relates to a vertical type construction transistor, and more particularly, to a vertical type construction transistor for power amplification use.

Recently, demand for power amplification transistor in a microwave band has increased. For example, a heterojunction-bipolar-transistor (hereinafter referred to as "HBT") of a vertical type construction is provided (for example, N. L. Wang and others, "Superhigh Power Efficiency Operation of Emitter Common and Base Common HBT in 10 GHz" IEEE Transaction on Microwave Wave and Techniques, vol. 38, No. 10, pp. 1381-1389). As the HBT has a high gain and a low output conductance as compared with already developed GaAsFETs, the HBT it is watched as a means for realizing high efficiency amplifier.

As the above described HBT operates with high current density, it becomes inevitably higher. For proper operation, the heating of a junction portion (pn junction) formed on a basic plate surface has to be released out of the semiconductor basic plate with better efficiency. In the above described document, a means for releasing the heating of the junction portion onto the side of the basic plate reverse face side is provided. Namely, (1) the semiconductor basic plate is cut down thinly, and (2) a via hole (a hole extending through a basic plate surface side from a basic plate reverse face side) immediately under an electrode pulled out from the junction portion to the periphery with a metallic material, which has better thermal conductivity being buried into the via hole.

When the above described features (1), (2) have been adopted, the following problems are caused.
  (i) In order to cut down the basic plate thinly and further, open a via hole, broken pieces are caused in the wafer so as to lower the yield.
  (ii) The above described via hole is subject to the restriction of the working precision and is separated by at least 5 μm or more from the junction portion (heated location). Thus, it is difficult to effectively reduce the heat resistance.
  (iii) In the microwave band, an outgoing line from the junction portion has an inductance which cannot be neglected, and functions as feedback inductance so as to suffer a loss.

As many problems are caused like this, conventionally the HBT could not be developed as the power amplification use in the microwave band.

SUMMARY OF THE INVENTION

Accordingly, the present invention has been developed with a view for substantially eliminating the above discussed drawbacks inherent in the prior art, and provides an improved vertical type construction transistor as its essential object.

Another important object of the present invention is to provide an improved vertical type construction transistor which can effectively release the heating of the junction portion formed on the basic plate surface, reduce the inductance of the outgoing line, and be put to practical use as the power amplification in the microwave band.

In accomplishing these and other objects, the vertical type construction transistor of the present invention is characterized in that a bump electrode is provided immediately on a junction portion formed on the semiconductor basic plate surface.

The above described bump electrode is desired to be made of gold or metal including gold.

The above described junction portion is composed of a boundary of an emitter region provided within a base region with the size of the emitter region being desired to be in approximate conformity with the width size of the above described bump electrode.

The above described emitter region is divided into a plurality of short strips of finger portions arranged in parallel. The longitudinal size of the finger portion and the width size of the bump electrode in this direction are desired to be set in the range of 5 μm through 40 μm.

The bump electrode provided immediately on the junction portion is positioned extremely close to the heating location. For example, in the case of the emitter top type HBT, the distance between the bump electrode and the heating location (base/collector junction) becomes the total (0.5 μm or so) of the emitter thickness and the base thickness. As compared with the conventional via hole provided, the outgoing distance becomes about one tenth. The above described bump electrode is connected to a heat sink, so that the radiating efficiency is considerably increased and the heat resistance is sharply reduced. The inductance is reduced to a minimum as the grounding is effected at the shortest distance from the emitter with a thick grounding conductor. The longitudinal type construction transistor can be put to practical use as the power amplification used in the microwave band.

When the above described bump electrode is made of gold or metal including gold, the thermal conduction ratio becomes larger than when the bump electrode is made of general lead - tin alloy. Accordingly, the thermal resistance is further reduced.

The above described junction portion is composed of a boundary of an emitter region provided within the base region. When the width size of the emitter region is in approximate conformity with the width size of the above described bump electrode (sectional size in a location contacting on the basic plate), the following advantages are provided as compared with a case where they are not in conformity. When the width size of the bump electrode is smaller than the width size of the emitter region, the radiating efficiency of a portion projected to the periphery of the bump electrode of the emitter region is reduced. When both the sizes are in conformity, the radiation of all the emitter regions is effected with better efficiency. When the width size of the bump electrode is larger than the width size of the emitter region, the bump electrode connected with the emitter is projected to the base region and the collector region, so that parasitic capacity (capacity Cbe between base/emitter, capacity Cce between emitter/collector) increases to make the element characteristics worse. When both the sizes are in conformity, such parasitic capacity is restrained to a small level. Therefore, element characteristics are improved.

The above described emitter region is often divided into a plurality of short strip finger portions arranged in parallel. When the size in the longitudinal direction of the finger region and the size of the above described electrode in this direction are set at the angle of 5 μm through 40 μm, this case has the following advantages as compared with a case where they are set out of the range. When the size in the longitudinal direction of the above described finger portion and the size of the above described bump electrode in this direction are set at 5 μm or lower, the thermal resistance of the bump electrode becomes extremely large. Because the width size and the height size of the bump electrode are generally finished in extent as equal, the gap between the element surface and the heat sink to be connected with the bump electrode becomes narrower, so that the parasitic capacity unfavorably increases. It is difficult to stably form the bump electrode of such a small size. When both the sides are set to 5 μm or more, the thermal resistance of the bump electrode, the parasitic capacity between the element surface and the heat sink can be respectively lowered to a practical level. The bump electrode can be formed by the general process of a plating method.

When the size of the longitudinal direction of the above described finger portion and the size of the above described bump electrode in this direction are set at 40 μm or more (the width size of the bump electrode is set to generally 80 through 110 μm), collector resistance, base resistance and parasitic capacity Cbe, Cce become a non-negligible level as discovered from various experimental results by the present inventor, thus resulting in worse element characteristics. When both the sizes are set at 40 μm or lower, the collector resistance, the base resistance and the parasitic capacity Cbe, Cce can be lowered respectively to a practical level. The parasitic capacity Cbe, Cce in this case is a static capacity among the base region exposed to the gap or periphery of the short strip of finger portions, the collector region and the bottom face of the bump electrode opposite to each region.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION FOR THE PREFERRED EMBODIMENTS OF THE INVENTION

Figure 1:
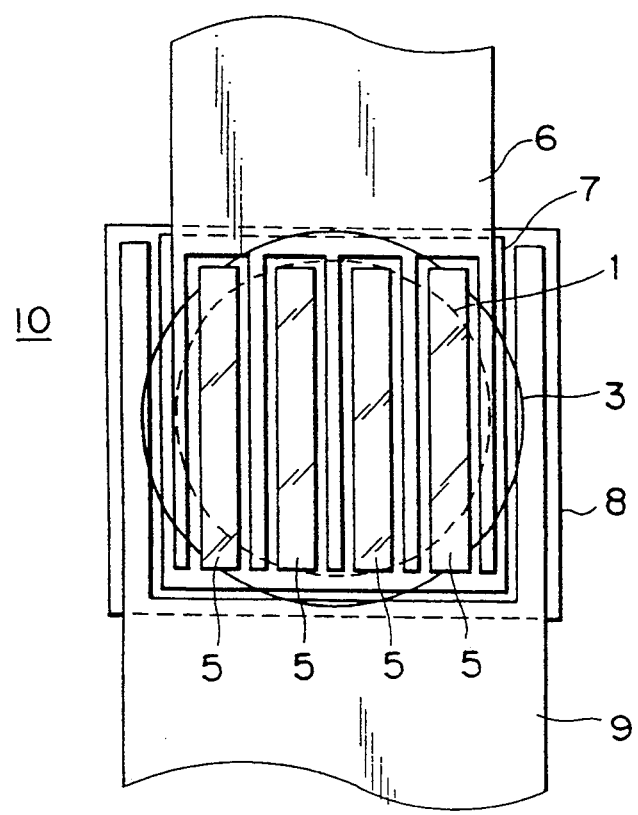
FIG. 1 is a view showing a plan pattern of a HBT in one embodiment of the present invention.

Before the description for the preferred embodiments of the present invention proceeds, it is to be noted that like parts are designated by like reference numerals throughout the accompanying drawings.

A vertical type construction transistor for an embodiment of the present invention will be described hereinafter in detail in accordance with the embodiment.

Figure 2:
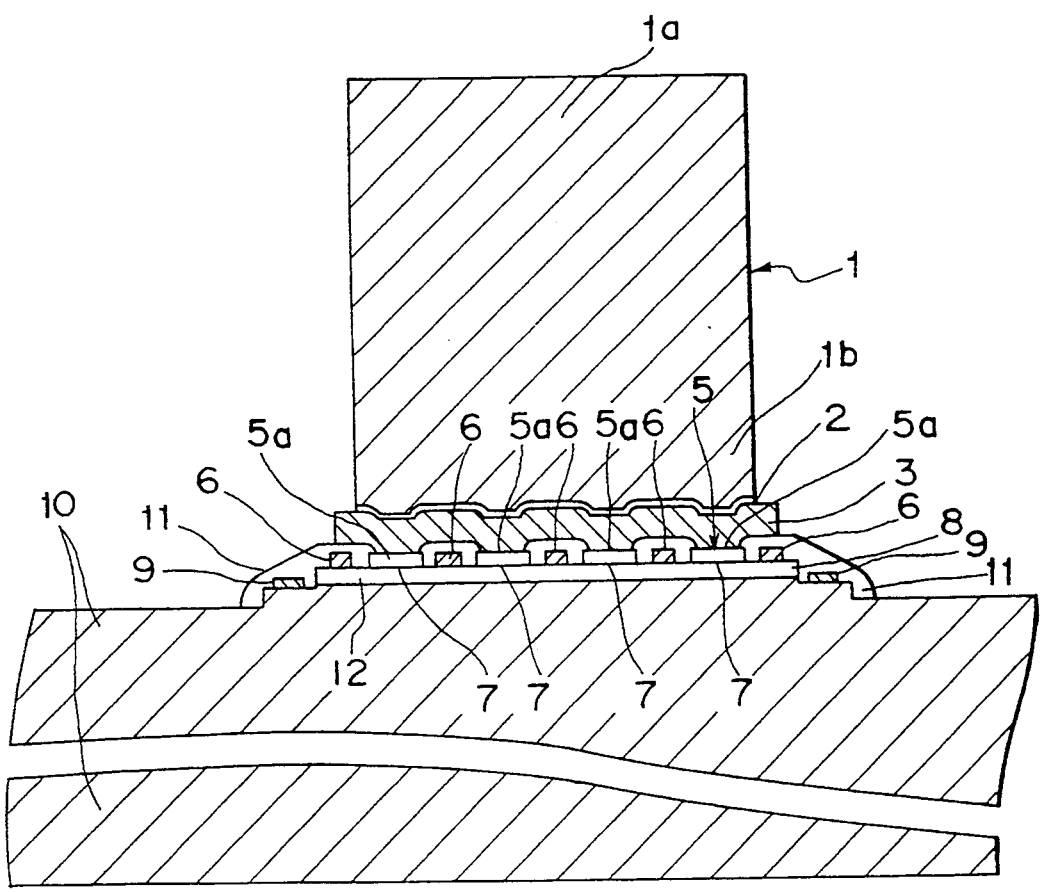
FIG. 2 is a view showing the sectional construction of the above described HBT.

FIG. 1 shows a plan pattern of a npn emitter top type HBT for microwave power amplification used in one embodiment of the present invention. FIG. 2 shows a sectional view of the above described HBT. As shown in these drawings, the HBT is provided with a collector layer 8, a base layer 7, an emitter layer 5 which are laminated in this order on the surface of the semi-insulating basic plate 10. As a junction portion, a base/collector junction is formed on the boundary between the collector layer 8 and the base layer 7. A base/emitter junction is respectively formed on the boundary between the base layer 7 and the emitter layer 5. A collector electrode 9, a base electrode 6, an emitter electrode 3 are respectively provided on each semiconductor layers 8, 7, 5. A cylindrical bump electrode 1 made of gold (Au) is provided through a Ti layer 2 immediately on the emitter electrode 3. As shown in FIG. 1, the above described emitter layer 5 is divided into four short strip shaped finger portions 5a arranged in parallel. The base electrode 6 is formed into a comb-shaped pattern on a base layer 7 exposed to the gap (and both the sides) of the finger portion 5a. The above described emitter electrode 3 is patterned and formed into approximately a circle shape, is respectively in contact with the four finger portions 5a, and is insulated from the base electrode 6 by an interphase insulating film 11. The collector electrode 9 is formed on both the sides of the base electrode 6. The reference numeral 12 is a sub-collector layer.

In the case of the high frequency junction portion, the width of the emitter finger portion 5a is desired to be made smaller so as to reduce the base resistance. But from the working precision and the other restrictions, the width of the above described finger portion 5a is set in the range of the general 1 through 4 μm. Similarly, although the base electrode 6, and the collector electrode 9 are desired to be smaller in width, they are set in the general 1 through 3 μm range from the working precision and the restriction of the electromigration resistance property. The size of the longitudinal direction of the finger portion 5a is set in the range of 5 through 40 μm. The width size (diameter) of the above described bump electrode 1 is set approximately the same as the size of the region where the finger portion, 5a are distributed, namely the emitter region, and are in the range of 5 μm through 40 μm.

This embodiment shows the emitter range in an approximate square, but if the emitter range is formed in a shape of longitudinal and the like, it is better to provide the size of the finger portion 5a in the longitudinal direction as same as the width size of emitter range, which should be almost identical to the width size of the bump electrode 1. This prevents a useless capacity from being generated by covering the bump electrode 1 over the base electrode 6 and extending the collector electrode 9 out in the longitudinal direction. By the way, it is easy to form the bump electrode 1 in a round shape, and it is better to shape the emitter range in an almost square like as in this embodiment.

The HBT is made as follows. As shown in FIG. 2, a collector layer 8 composed of AlGaAs/GaAs, a base layer 7, an emitter layer 5, a base electrode 6, and a collector electrode 9 are formed (the sum of the thickness of the base layer 7 and the emitter layer 5 is approximately 0.5 μm) are formed on the surface of the semiinsulating GaAs basic plate 10 by a known procedure (as described in, for example, Electronic Communication Society Technical Research Report ED90135). The base electrode 6 and the collector electrode 9 are covered with the use of polyimide as an interphase insulating film 11 and an opening is provided immediately on the emitter finger portion 5a (an opening for connecting with the element outer portion the base electrode 6, and the collector electrode 9 is open in a location away which is not shown).

An emitter electrode (protection electrode layer) 3 composed of Ti/Pt/Au is formed in a circular shape approximately immediately on the above described emitter region. A circular shaped opening is provided in a portion (region to be provided on a bump electrode 1) on the emitter electrode 3 of the SiNx film with a SiNx film not shown being accumulated on all the faces as a passivation film. The Ti layer 2 is evaporated on the whole face. A circular shaped opening is provided in a portion (region for a bump electrode 1 to be provided) on the emitter electrode 3 of the above described resist after the resist is applied, so that photo-lithography is effected. A bump electrode 1 composed of Au is formed by a plating method. Finally, the remaining resist is removed, and a Ti layer 2 remaining in the region except for a bump electrode 1 is removed with a wet etching operation so as to complete the process.

Figure 3:
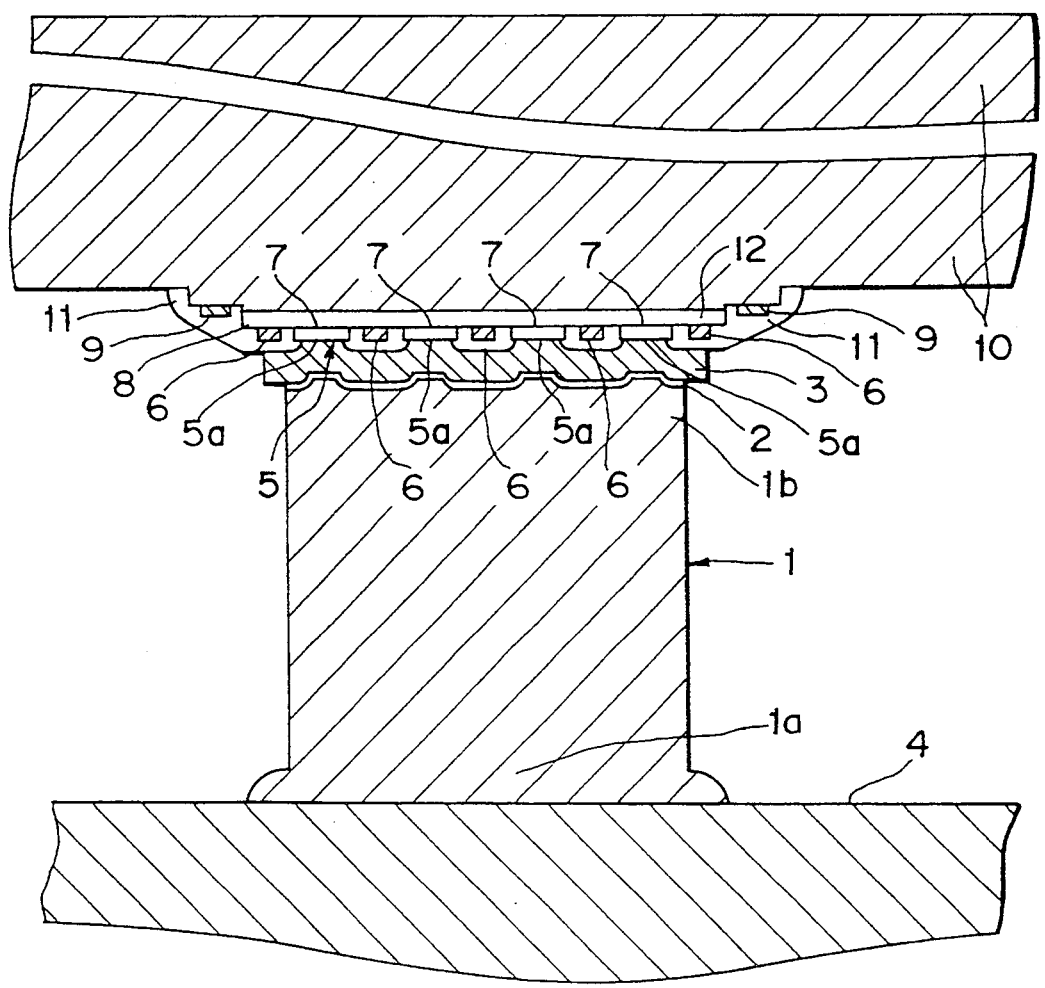
FIG. 3 is a view showing a condition where the above described HBT is flip-chip-bonded in a heat sink.

The distance between the bump electrode 1 of the above described HBT and the heating location (base/-collector junction) is the sum (approximately 0.5 μm) of the emitter thickness and the base thickness, so that the bump electrode 1 and the heating location are extremely adjacent to each other. As shown in FIG. 3, the upper portion 1a of the above described bump electrode 1 is bonded (flip-chip bonded) in the heat sink 4 so that the radiating efficiency is considerably increased, and the thermal resistance can be considerably reduced. At the same time, the grounding can be effected in the shortest distance from the emitter electrode 3 and with a thick grounding conductor so that the inductance can be reduced to a minimum. The HBT can be put to practical use as power amplification used in the microwave band.

As the above described bump electrode is composed of gold (Au), the thermal conduction ratio can be made larger than the general lead - tin alloy. Accordingly, the thermal resistance can be further reduced.

As the width size of the above described emitter region is in approximate conformity with the width size of the portion 1b on the basic plate side of the above described bump electrode 1, the radiation of all the emitter regions can be effected with better efficiency. The bump electrode 1 does not project to the basic region and the collector region. The parasitic capacity such as capacity Cbe between base/emitter, capacity Cce between emitter/collector, and so on can be restrained to a small level. Therefore, the element characteristics can be improved.

From the various experiment results by the present inventor, the size in the longitudinal direction of the emitter finger portion 5a and the size of the above described bump electrode 1 in this direction are set at a optimum range 5 through 40 μm. The HBT can be made lower respectively to a practical level in the parasitic capacity among the thermal resistance of the bump electrode 1, the element surface and the heat sink 4. The bump electrode 1 can be formed with the general process by a plating method (it cannot be formed by the plating method when the width size of the bump electrode becomes 5 μm or lower). The collector resistance, the base resistance and the parasitic capacity Cbe, Cce can be lowered respectively to a practical level. The parasitic capacity Cbe, Cce in this case is the capacity among the base region exposed to the gap or periphery of the short strip of finger portions 5a, the collector region, and the bottom face of the bump electrode opposed to each of the regions.

Figure 4:
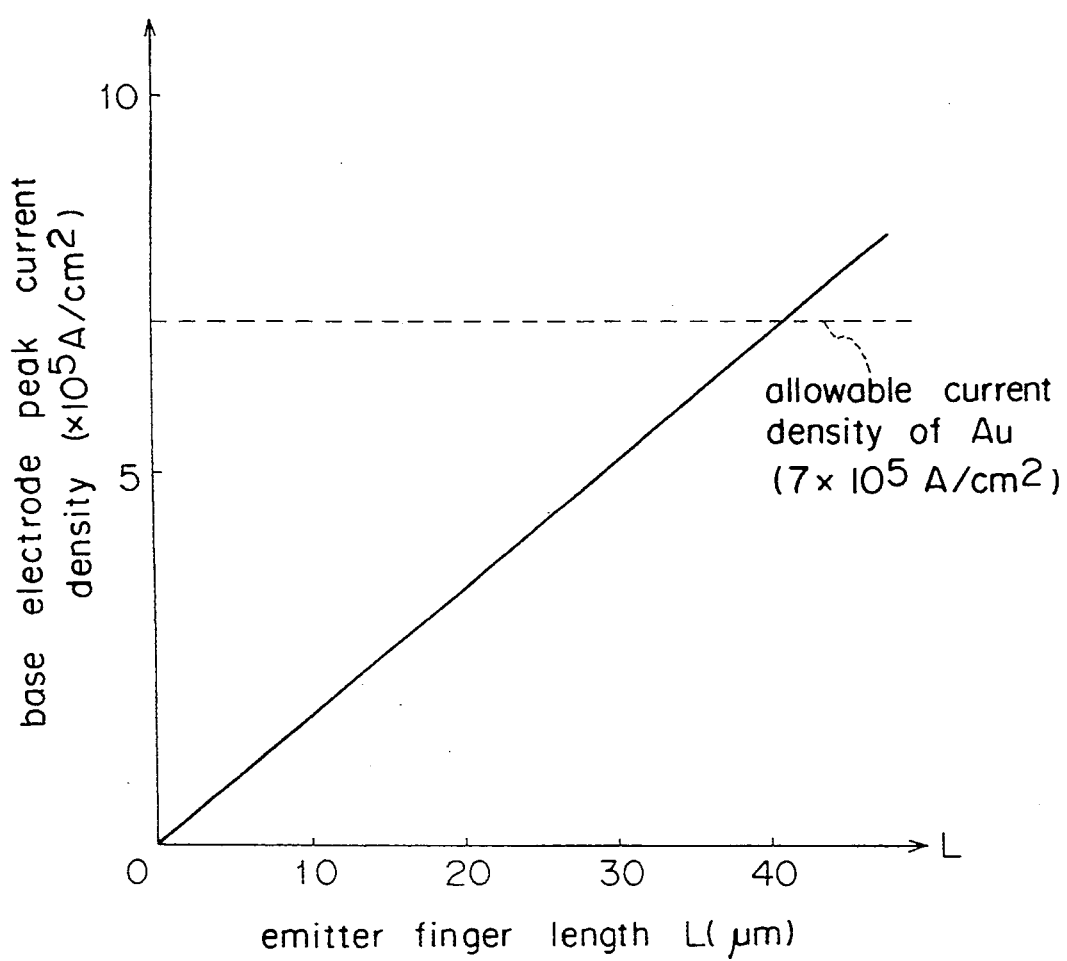
FIG. 4 is a graph showing an allowable current density of Au in the physical working limit dimensions of the bump electrode in relationship of the emitter finger length and base electrode peak current density.

FIG. 4 is a graph showing a relationship between the length L of finger portion 5a and the peak current density of high frequency signals within the base electrode. For instance, in the case that a transistor having dimensions suitable for exploiting an embodiment of the present invention such as one having emitter fingers of four pieces in widths of 3μ and a bump electrode in a width of 1 μm providing the connection of wires in piling up Au of 4μ thickness onto a thin contact metal is operated, the length L of the emitter finger becomes more or less of 40 μm in size so that the peak current density of signals flowing within the base electrode 6 is going to increase beyond the electron migration allowance current density of Au. Also, in the case el employing Ta in place of Au, the allowable current density becomes large with the resistance also being large, and in the case of employing Al, Cu, the allowable current density becomes small, which result in Au being more suitable for the present invention. It is noted that the width size of bump electrode is selected within the range of 5 to 40 μm, and in the case of providing emitter fingers in 3 μm width, it is better to provide a length of 20 μm in view of the high frequency property. However, on the consideration of yield in the present technical level, it is more practical to provide one having two fingers of 6.4 μm in width and 20 μm of length.

Although the radiation from the reverse side of the element basic plate 10 is not effected particularly in the present embodiment, the reverse face of the basic plate 10 is cut down thinly and a radiating function can be combined by way of heating solder, a case cap and so on. In the above described HBT, the bump electrode 1 functions as an emitter electrode 3, but is not restricted to functioning as the emitter electrode 3. The bump electrode 1 may be connected with, instead of an emitter 3, a base electrode 6 or a collector electrode 9. The bump electrode 1 is not used as an electrode, but has only to effect thermal radiation.

Although the collector layer 8, the base layer 7, the emitter layer 5 are formed on the semiconductor basic plate 10 in this order in the present embodiment, the emitter layer, the base layer, the collector layer may be formed reversibly in this order. The conductive type of each of the above described conductive layers 8, 7, 5 may be reversed from a npn type to a pnp type.

The construction of the transistor may be a so-called single hetero bipolar transistor (SHBT) with only the emitter layer being large in the band gap, and may be a double hetero bipolar transistor (DHBT) with a wide band gap material used even in the collector layer. The transistor will do if it is a vertical type construction transistor. For example, a hot electron transistor, a resonance tunnel transistor or the like will do. A transistor which does not have a bipolar operation as a basic principle will do.

A composition of the above described semiconductor layers 8, 7, 5 is not restricted to the AlGaAs/GaAs, but may be other grid matching systems such as InGaAs/InAlAs system, InGaAs/InP system and so on or grid non-matching systems such as InGaAs/AlGaAs and so on.

In order to improve the element characteristics, Cbc may be adapted to be reduced by the injection of O+, B+, H+ ions immediately under an external base, and to be separated in construction among elements by the ion injection.

As is clear from the foregoing description, the vertical type construction transistor of the present embodiments can have the distance between the bump electrode and the heating location in extreme proximity as compared with the conventional distance, as the bump electrode is provided immediately on the junction portion formed on the semiconductor basic plate surface. The radiation efficiency can be considerably increased, and the thermal resistance can be sharply reduced by the bonding of the above described bump electrode in the heat sink. At the same time, grounding can be effected at the shortest distance, and with the thick grounding conductor, thus reducing the inductance to a minimum. The HBT can be put into practical use as the power amplification used in the microwave band.

When the above described bump electrode is composed of gold or metal including gold, the thermal conduction ratio can be made larger than in the general lead - tin alloy, so that the thermal resistance can be further reduced.

The above described junction portion is composed of the boundary of the emitter region provided within the base region. When the size of the emitter region is in approximate conformity with the width size of the above described bump electrode, the radiation of all the emitter region area can be effected with better properties. Further, the parasitic capacity such as capacity $C_{be}$ between the base/emitter, capacity $C_{ce}$ between the emitter/collector and so on can be restrained to a small level, thus improving the element characteristics.

The above described emitter region is divided into a plurality of short strips of finger portions arranged in parallel. When the size in the longitudinal direction of the finger portion and the width direction of the above described bump electrode in this direction are set in the range of 5 $\mu$m through 40 $\mu$m, the thermal resistance of the above described bump electrode, the parasitic capacity between the element surface and the heat sink, the collector resistance, the base resistance, the parasitic capacity $C_{be}$, $C_{ce}$ can be respectively lowered to the practical level. The bump electrode can be formed with the general process by the plating method.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A vertical type construction transistor comprising:
   a semiconductor basic plate;
   a junction portion formed on a surface of said semiconductor basic plate, said junction portion including a boundary of an emitter region provided within a base region; and
   a bump electrode provided immediately on said junction portion, said emitter region being of a size in approximate conformity with a width of said bump electrode and said emitter region being divided into a plurality of short strips of finger portions arranged in parallel with a size in a longitudinal direction of said finger portions and said width of said bump electrode in said longitudinal direction being set in a range of 5 $\mu$m–40 $\mu$m.

2. A vertical type construction transistor as defined in claim 1, wherein said bump electrode comprises gold or a metal including gold.

3. A method for forming a vertical type construction transistor, comprising the steps of:
   (a) forming a junction portion on a surface of a semiconductor basic plate;
   (b) providing a boundary of an emitter region within a base region of said junction portion;
   (c) providing a bump electrode immediately on said junction portion;
   (d) approximately conforming a size of said emitter region with a width of said bump electrode; and
   (e) dividing said emitter region into a plurality of short strips of finger portions arranged in parallel with a size in a longitudinal direction of said finger portions and said width of said bump electrode in said longitudinal direction being set in a range of 5 $\mu$m–40 $\mu$m.

4. A method for forming a vertical type construction transistor as defined in claim 3, wherein said bump electrode comprises gold or a metal including gold.

* * * * *